United States Patent
Holle et al.

(10) Patent No.: US 7,362,232 B2
(45) Date of Patent: Apr. 22, 2008

(54) ELECTRICAL SERVICE DISCONNECT HAVING EXTERNAL INTERFACE

(75) Inventors: Brett Holle, Lafayette, IN (US);
Michael Anderson, Lafayette, IN (US);
John Voisine, Lafayette, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 139 days.

(21) Appl. No.: 11/431,440

(22) Filed: May 10, 2006
(Under 37 CFR 1.47)

(65) Prior Publication Data
US 2006/0232433 A1 Oct. 19, 2006

Related U.S. Application Data

(63) Continuation of application No. 10/085,426, filed on Feb. 28, 2002, now Pat. No. 7,091,878.

(60) Provisional application No. 60/272,023, filed on Feb. 28, 2001.

(51) Int. Cl.
*G08B 21/00* (2006.01)

(52) U.S. Cl. .............. 340/667; 340/637; 340/644; 340/870.02; 324/110; 324/142; 324/157

(58) Field of Classification Search .......... 340/667, 340/637, 644, 870.02, 870.06; 324/110, 324/142, 157
See application file for complete search history.

(56) References Cited

U.S. PATENT DOCUMENTS

| 4,359,684 | A | 11/1982 | Ley |
| 5,033,973 | A | 7/1991 | Pruehs et al. |
| 5,045,969 | A | 9/1991 | Menasco |
| 5,251,653 | A * | 10/1993 | Tucker et al. ............... 137/460 |
| 5,345,225 | A | 9/1994 | Davis |
| 5,488,565 | A | 1/1996 | Kennon et al. |
| 5,546,269 | A | 8/1996 | Robinson et al. |
| 5,668,538 | A | 9/1997 | Warwick |
| 5,940,009 | A | 8/1999 | Loy et al. |
| 5,952,739 | A | 9/1999 | Grass et al. |
| 6,104,586 | A | 8/2000 | Robinson |
| 6,118,269 | A | 9/2000 | Davis |
| 6,232,886 | B1 | 5/2001 | Morand |
| 6,275,168 | B1 | 8/2001 | Slater et al. |
| 6,605,937 | B2 | 8/2003 | Germer et al. |
| 2007/0117436 | A1 * | 5/2007 | Davis ........................ 439/188 |

FOREIGN PATENT DOCUMENTS

EP 0 455 518 6/1991

* cited by examiner

*Primary Examiner*—Tai Nguyen
(74) *Attorney, Agent, or Firm*—Maginot, Moore & Beck

(57) ABSTRACT

An arrangement is provided for use in an electrical utility meter that includes a metering unit, a service disconnect circuit, and a housing assembly. The service disconnect circuit has a connected state that operably couples utility power lines to a load, and a disconnected state and as armed state that operably decouples the utility power lines from the load. The housing assembly is disposed over the metering unit and the service disconnect circuit, and has at least one electronic indicator visible to an outside of the housing assembly. The electronic indicator is operable to provide a visual signal representative of the service disconnect circuit in the armed state. The housing further includes an externally accessible actuator operably connected to the service disconnect circuit to change the service disconnect switch from the armed state to the connected state.

23 Claims, 7 Drawing Sheets

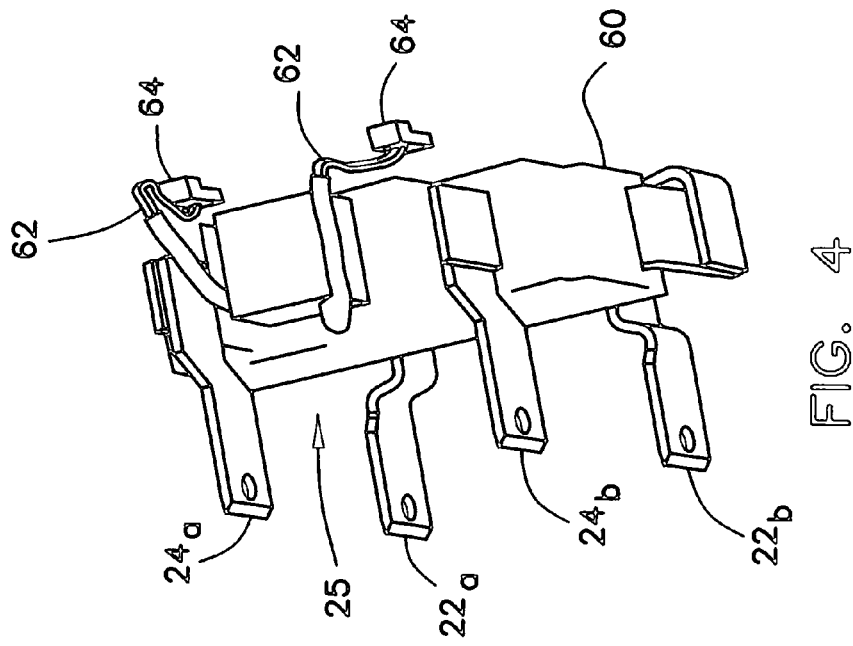
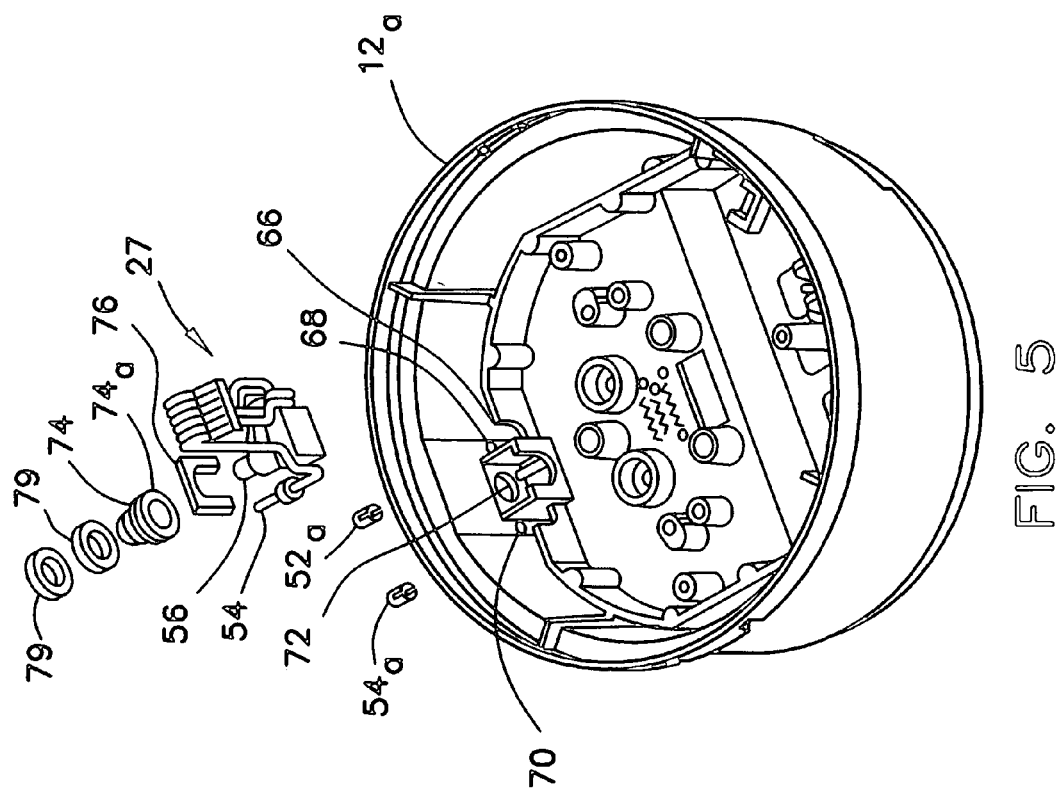
FIG. 4
FIG. 5

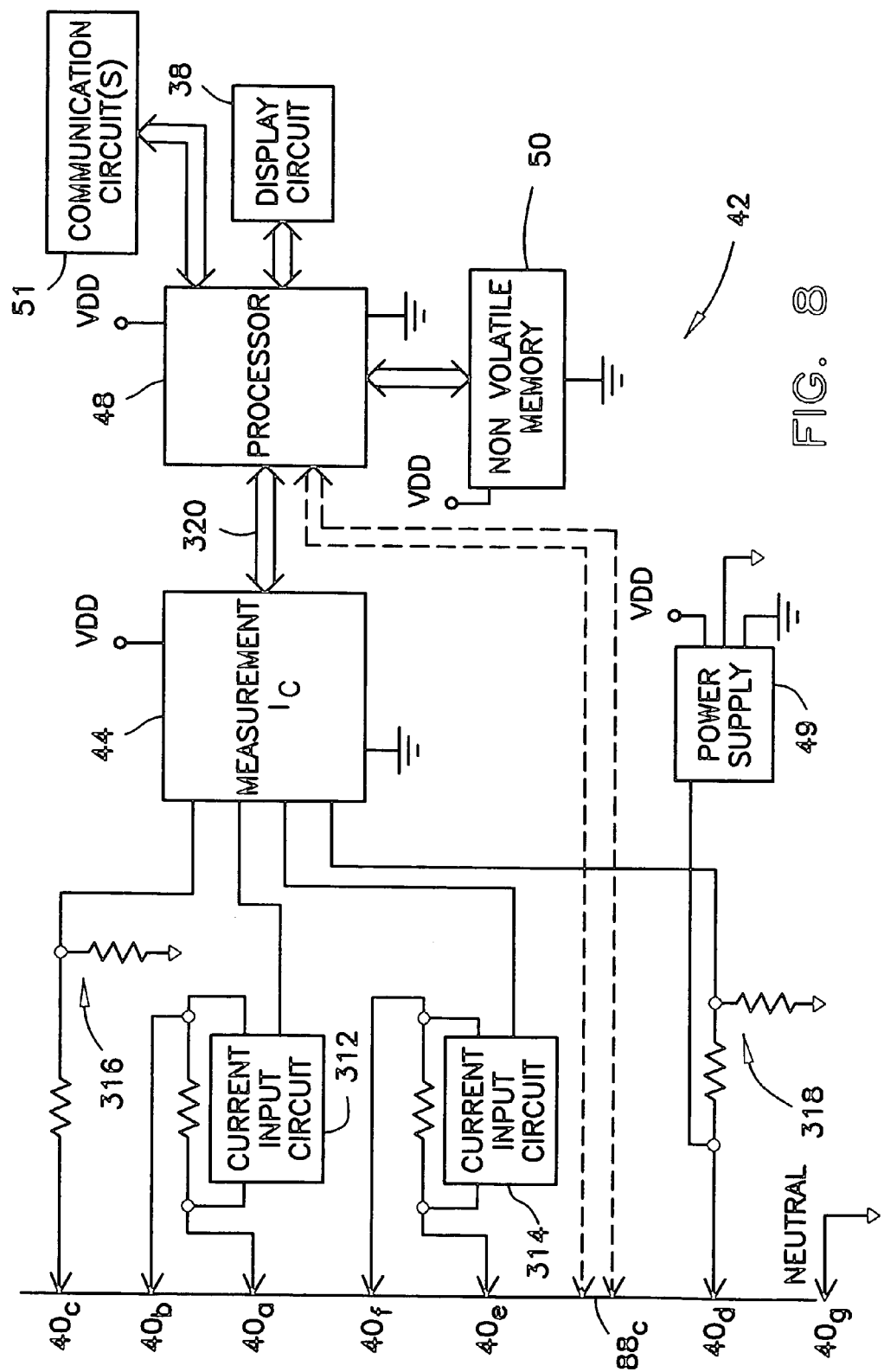

ELECTRICAL SERVICE DISCONNECT HAVING EXTERNAL INTERFACE

This application claims the benefit of U.S. Provisional Patent Application Ser. No. 60/272,023, filed Feb. 28, 2001, and which is incorporated by reference herein.

FIELD OF THE INVENTION

The present invention relates generally to electricity meters, and more particularly to electricity meters that are used in conjunction with load disconnect devices.

BACKGROUND OF THE INVENTION

Electrical service providers such as electrical utilities employ electricity meters to monitor energy consumption by customers (or other entities). Electricity meters track the amount of energy consumed a load (e.g. the customer), typically measured in kilowatt-hours ("kwh"), at each customer's facility. The service provider uses the consumption information primarily for billing, but also for resource allocation planning and other purposes.

Electrical power is transmitted and delivered to load in many forms. For example, electrical power may be delivered as polyphase wye-connected or delta-connected power or as single phase power. Such various forms are known as service types. Different standard electricity meter types, known as meter forms, are used to measure the power consumption for the various service types. The commonly used meter forms in the United States include those designated as 2S, 3S, 5S, 45S, 6S, 36S, 9S, 16S, 12S and 25S meter forms, which are well known in the art.

Electrical service providers have historically billed for electrical service in arrears, using information stored within the electricity meter to determine the amount of each invoice. In a typical operation, the electricity meter stores a value representative of the amount of energy consumed in a mechanical or electronic accumulation register. From time to time, the electrical service provider obtains the value of the register and bills the customer accordingly. For example, a meter reader employed by the service provider may, each month, physically read the register value off a meter display. The service provider then employs the obtained register value to determine the amount of electricity consumed over the month and bills the customer for the determined amount.

A problem with the above-described operation of electrical service providers arises from the fact that some customers are frequently delinquent in or, in default of, payments for electricity consumption. Because electrical service is billed in arrears, delinquent payments can result in significant losses for the service provider.

In addition, interrupting the delivery of electrical power has historically been an expensive and significant event. Typically, a technician must be dispatched to the customer's residence, or in the vicinity thereof, to physically disconnect the power. Accordingly, while the electrical service provider might physically disconnect the power to the customer's facility for several months of complete payment default, physical disconnection is not practical in circumstances in which customers are merely delinquent, or that can only pay portions of their bills. In particular, the cost an effort of sending a technician out to disconnect electrical service is wasted if the customer pays a day or two later, thereby requiring another service call to restore service.

One method of controlling losses associated with delinquent customers is to require prepayment for services. In prepayment arrangements, customers use prepaid debit cards or credit cards to "purchase" energy in advance. When the purchased energy has been consumed, the electrical service is disconnected. Thus, the service provider is not exposed to extended periods of electrical service for which no payment may be provided. Another method of handling delinquent customers is to intermittently interrupt power to delinquent customers until the past due payments are made. Intermittent interruptions tend to reduce the amount of energy consumed by the delinquent payor, thus advantageously reducing utility provider losses while also reducing bills to the delinquent payor.

Each of the above methods, however, typically requires the ability to disconnect and/or reconnect the customer's power without a technician service call to the customer's location. For example, in a prepayment scenario, the service provider must have a method of disconnecting power once the prepaid amount of energy has been consumed. Similarly, the intermittent interruption technique requires frequent connection and disconnection of the electrical service.

One technique for automated or remote service disconnection is to employ a service disconnect switch device within an electricity meter. The service disconnect switch is a relay or other device that controllably disconnects and re-connects the utility power lines to the customer's feeder lines, thereby controllably interrupting power to the customer's facility. In some cases, the service disconnect switch is tripped by a remote device that communicates with the electricity meter circuitry through a modem, radio or the like. Alternatively, such as in the case of prepayment, the meter itself may be programmed to disconnect and reconnect electrical service under certain circumstances. In some situations, the meter may disconnect and restore electrical service through a combination of local programming and remote commands.

Thus, the inclusion of a service disconnect switch within a meter facilitates various methods and techniques for providing electrical service to parties that have poor payment records. Such methods and techniques advantageously do not require a permanent disconnection by a field technician. The conveniences provided by a service disconnect switch also extends beyond use in connection with delinquent payors. For example, electrical energy rationing may be implemented using techniques enabled by the service disconnect switch.

Nevertheless, various issues that arise from the use of a service disconnect switch have not been adequately addressed in the prior art. For example, many of the above described service interruption techniques typically require automated reconnection to be truly viable. In other words, if a technician must be dispatched every time power is to be reconnected to a customer after a service interruption, the convenience and cost advantages of the automated disconnection are significantly reduced.

Automatic reconnection of a customer's facility to electrical service can raise potential dangers. For example, consider a situation in which the customer is operating a clothes iron or electric stove when electrical service is disconnected. If the customer does not remember to turn such a device off during the electrical service interruption, then the device will automatically resume operating (at high temperatures) when power is restored. The automatic restoration of iron or stove operation can create a fire hazard, particularly if the customer has since become otherwise occupied or has left the premises. Accordingly, restoring power through an automatically operated service disconnection switch raises some safety issues, as well as other issues.

In addition to safety issues, a drawback of service disconnect switches is that they may be defeated through tampering either within or external to the meter. Such tampering typically involves placing a bypass around the service disconnect switch. The bypass provides a path through which the customer may receive electrical power even though the service disconnect switch has been opened.

One prior art device disclosed in U.S. Pat. No. 5,940,009 detects such tampering by detecting a voltage signal on the load-side connection of a disconnect switch. In particular, this prior art device connects the load-side customer feeder lines to a processor through a voltage divider. The processor then interprets the waveforms of from multiple feeder lines to determine whether power is still being provided to the load even when a service disconnect switch has disconnected the service to the customer's load. The drawback of the device disclosed in U.S. Pat. No. 5,940,009 is that it requires multiple inputs to a microprocessor to monitor multiple feeder lines, and further exposes the microprocessor directly to the power line signals, albeit through a voltage divider.

Other issues with service disconnect devices within meters include whether and how a disconnect switch could be implemented in a modular meter. Modular meters are those that include separable components. One removable component includes much of the meter electronic and processing circuitry while the other component contains high voltage sensor circuitry that interconnects with the power lines. Modular meters allow for easy enhancement of meter features and operations because replacement of the removable component that includes the meter electronic and processing circuitry typically suffices for such enhancements. Thus, to obtain improved functionality, only a portion of the meter must be replaced. Service disconnect switches do not readily lend themselves to modular meters because service disconnect switches require both electronic and high power components, which are typically separated into different modules of the modular meter.

There is a need, therefore, for an electricity meter that employs service disconnect switch and that avoids one or more of the above described drawbacks. In particular, a need exists for an electricity meter that includes a service disconnect switch having increased safety enhancements associated with reconnecting a customer's electrical service after an interruption. A need exists for an electricity meter that obtains the benefits of both modularity in a meter and the use of an automatically operated service disconnect switch within a meter.

SUMMARY OF THE INVENTION

The present invention fulfills the above needs, as well as others, by employing a service disconnect circuit within a meter that includes an externally accessible actuator that changes the service disconnect circuit from an armed (but not connected) state to a connected state. In such a device, the service disconnect circuit may only be automatically armed, as opposed to automatically restoring power. The restoration of power occurs when the customer (or another person at the customer residence) actuates the externally accessible actuator. As a result, power is never restored when no one is present at the residence, thereby enhancing safety.

One embodiment of the invention is an arrangement for use in an electrical utility meter that includes a metering unit, a service disconnect circuit, and a housing assembly. The metering unit is operably coupled to utility power lines. The utility power lines are connected to a load. The metering unit is operable to generate metering information representative of an electrical quantity regarding electrical energy delivered to the load. The service disconnect circuit has a connected state, a disconnected state, and an armed state. The service disconnect circuit in the connected state operably couples the utility power lines to the load. The service disconnect circuit in the disconnected state and the armed state operably decouples the utility power lines from the load. The housing assembly includes at least one housing, or module housing, disposed over the metering unit and the service disconnect circuit, and has at least one electronic indicator visible to an outside of the housing and operable to provide a visual signal representative of the service disconnect circuit in the armed state. The housing assembly further includes an externally accessible actuator operably connected to the service disconnect circuit to change the service disconnect switch from the armed state to the connected state.

In another aspect of the invention, an arrangement for use in an electrical utility meter comprises at least one indicator lamp affixed to a meter housing, in which the at least one indicator lamp is operable to provide a visual signal. In one aspect of the invention, the visual signal corresponds to a service disconnect circuit being in an armed state, where the service disconnect circuit has as armed state, a disconnected state, and a connected state. In this embodiment, the service disconnect circuit is controllably coupled to an electrical power line to controllably disconnect and connect the electrical power line to a load. In certain embodiments, the arrangement can further include an externally accessible actuator. The externally accessible actuator is operably coupled to cause the service disconnect circuit to change from the armed state to the connected state when actuated.

The invention further contemplates a method comprising the initial step of placing a service disconnect circuit in an armed state, where the service disconnect circuit is operably coupled to an electrical power line to controllably connect and disconnect the electrical power line from a load. The method further includes generating a first visual signal on an electronic indicator disposed on a meter housing, the first visual signal corresponding to the placement of the service disconnect circuit in the armed state. In a further aspect, the method includes the additional steps of placing the service disconnect circuit in a connected state, and halting generation of the first visual signal. In yet another feature, the step of placing the service disconnect circuit in a connected state can include placing the service disconnect circuit in a connected state responsive to actuation of an externally accessible actuator disposed on the meter housing.

The above-described features and advantages, as well as others, will become more readily apparent to those of ordinary skill in the art by reference to the following detailed description and accompanying drawings.

BRIEF DESCRIPTION OF THE DRAWINGS

FIG. 4 shows a perspective view of a service disconnect switch module for use in the modular electricity meter of FIG. 2;

FIG. 5 shows a perspective view of an external interface assembly for use in the modular electricity meter of FIG. 2;

FIG. 8 shows a schematic diagram of the measurement module of the modular electricity meter of FIG. 2.

DETAILED DESCRIPTION

Figure 1:
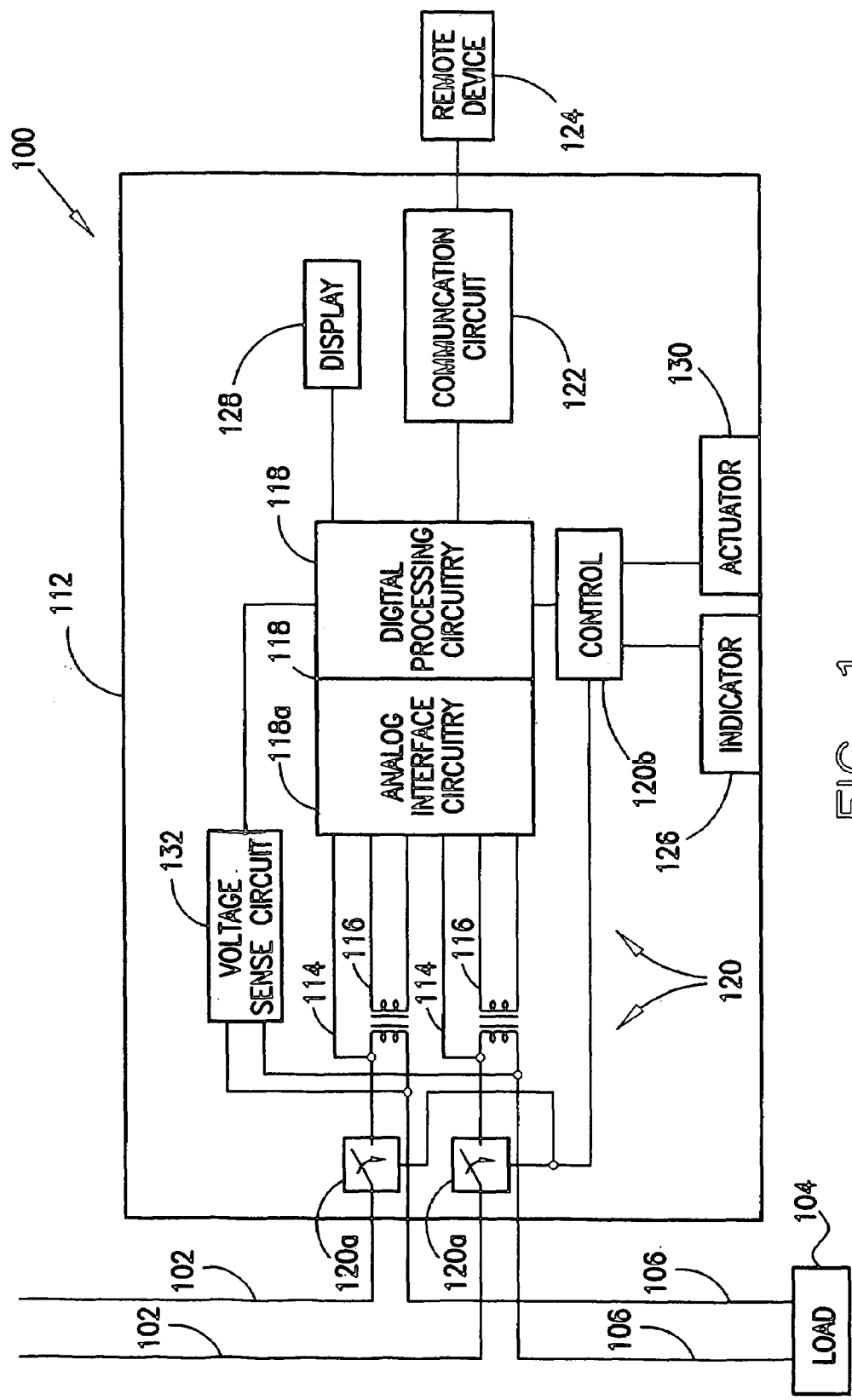
FIG. 1 shows a block diagram of an exemplary meter having a service disconnect circuit arrangement in accordance with aspects of the present invention.

Referring now to the drawings, and more particularly to FIG. 1, a diagram of an electrical utility meter 100 constructed according to aspects of the present invention is shown. In FIG. 1, the meter 100 is operably coupled to utility power lines 102. The utility power lines 102 are connected to a source of electricity, such as a power transmission and distribution system, not shown. A load 104 (typically a consumer of electrical power) is connected to the power lines 102 through feeder lines 106. The meter 100 is operably coupled to the feeder lines 106 to detect the amount of electricity delivered to the load. The meter 100 is operable to, among other things, generate metering information representative of a quantity of electrical energy delivered to the load 104.

A housing assembly 112 is disposed over the meter 100 and encases various components thereof. Voltage sensors 114 and current sensors 116 are secured within the housing assembly 112, and are operable to receive voltage and current signals representative of voltage and current provided to the load 104 and generate measurement signals therefrom. In particular, the measurement signals generated by the voltage sensors 114 and current sensors 116 are analog signals each having a waveform representative of the voltage and current provided to the load 104. For purposes of example and explanation, FIG. 1 illustrates two voltage sensors 114 and current sensors 116 for generating measurement signals for two-phase electrical service, or for two sides of a 240-volt single-phase three-wire electrical service. However, it will be intuitive to those skilled in the art that the principles of the present invention may also be applied to three-phase power systems.

A processing circuit 118 is operable to receive the analog measurement signals from the voltage sensors 114 and the current sensors 116 and generate energy consumption data therefrom. According to an exemplary embodiment, the processing circuit 118 includes analog interface circuitry 118a that receives and digitizes the measurement signals, and digital processing circuitry 118b that processes the digitized measurement signals to thereby generate the energy consumption data. Such circuits are well known in the art. According to an alternative embodiment, however, the processing circuit 118 generates the energy consumption data by operating directly upon the analog measurement signals. As is known in the art, the processing circuit 118 may include one or more integrated circuits.

The meter 100 includes a service disconnect circuit 120 that comprises one or more service disconnect switches 120a and a logical control portion 120b. It will be appreciated that the logical control portion 120b and the processing circuit 118 may suitably share some or all of the same components and/or circuitry. However, in other embodiments including the one described below in connection with FIGS. 2 through 8, the control portion of the service disconnect circuit and the processing circuit of the meter are completely distinct circuits. It will also be appreciated that the control portion 120b and the service disconnect switch 120a may be housed in a single structure. However, in the embodiment of FIGS. 2 through 8, the control portion located on a circuit board that is distinct from the service disconnect switch.

Referring again to FIG. 1, one or more service disconnect switches 120a are operably coupled to the processing circuit 118 within the housing assembly 112, and selectively connect and disconnect the power lines 102 to the load 104 under the control of the processing circuit 118. In general, the service disconnect circuit 120 has a connected state, a disconnected state, and an armed state. The states of the service disconnect circuit 120 are maintained within the control portion 120b. The control portion 120b controls the service disconnect switches 120a in accordance with the state logic.

More specifically, in the connected state, the service disconnect switch 120a operably couples the power lines 102 to the load 104 so as to provide electrical power thereto. In the disconnected and armed states, the service disconnect switch 120a operably decouples the power lines 102 from the load 104 so as to remove the supply of electrical power therefrom. Indeed, the control circuitry of the service disconnect switch may constitute a portion of the processing circuit 118 of the meter.

The service disconnect circuit 120 changes from the connected state to the disconnected state in response to a first signal received from the processing circuit 118, and changes from the disconnected state to the armed state in response to a second signal within the processing circuit 118. It should be noted that the signals that cause the state changes may be provided on one or more physical line A communication circuit 122 is operably coupled to the processing circuit 118, and is also operable to receive signals from a remote device 124. The communication circuit 122 may, for example, receive signals from the remote device 124 via a tangible communication link (e.g., cable, wire, fiber, etc.), or via a wireless communication link. According to one aspect of the invention, the communication circuit 122 is operable to receive a disconnect signal from the remote device 124. In response to the disconnect signal, the communication circuit 122 provides information representative of the disconnect signal to the processing circuit 118. The processing circuit 118 in turn provides the first signal to the control portion 120b of service disconnect circuit 120, thereby causing the service disconnect circuit 120 to change from the connected state to the disconnected state. In the disconnected state, the service disconnect switches 120a disconnect the feeder lines 106 from the power lines 102.

According to another aspect of the invention, the communication circuit 122 is operable to receive an arm signal from the remote device 124. In response to the arm signal, the communication circuit 122 provides information representative of the arm signal to the processing circuit 118. The processing circuit 118 in turn provides the second signal to the service disconnect circuit 120, thereby causing the service disconnect circuit 120 to change from the disconnected state to the armed state. In the armed state, as discussed above, the switches 120a do not immediately reconnect the feeder line 106 to the power lines 102.

As will be more fully discussed below, the service disconnect circuit 120 changes from the armed state to the connected state responsive to actuation of an externally accessible actuator 130.

One or more electronic indicators 126 are operably coupled to the control portion 120a and provide visual signals regarding operation of the service disconnect circuit 120. Each indicator 126 may, for example, be embodied as an indicator lamp comprising a light emitting diode, or as a liquid crystal display segment. According to an exemplary embodiment, each indicator 126 is visible external to the housing assembly 112 and is operable to provide a visual signal representative of the current state of the service disconnect circuit 120. For example, the indicator 126 may include a first indicator lamp that provides a visual signal indicative of one or more service disconnect switches 120 in the armed state, and a second indicator lamp that provides a visual signal indicative of one or more service disconnect switches 120 in the disconnected state. Alternatively, the indicator 126 may be embodied as a single element which provides a first visual signal indicative of one or more service disconnect switches 120 in the armed state, and a second visual signal indicative of one or more service disconnect switches 120 in the disconnected state. It will be appreciated that in alternative embodiments, the indicators 126 may be connected to the processing circuit 118 as opposed to the control portion 120a of the service disconnect circuit 120.

A display 128 is operably coupled to the processing unit 118 and provides a visual display of information, such as information regarding the operation of the meter 100. For example, the display 128 may provide a visual display regarding the power measurement operations of the meter 100. The display 128 and the indicator 126 may be separate and distinct elements of the meter 100, as shown in FIG. 1, or may be combined into a single display unit.

An actuator 130 is operably coupled to each service disconnect switch 120. When actuated, the actuator 130 causes one or more service disconnect switches 120 to change from the armed state to the connected state. The actuator 130 is coupled to the control portion 120b of the service disconnect switch 120, or may be directly coupled to each service disconnect switch 120. The actuator 130 is preferably disposed on the housing assembly 112, and is accessible from an external portion of the housing assembly 112. The actuator 130 may, for example, be embodied as one or more pushbutton mechanisms or other elements that may be actuated by a user.

A voltage sense circuit 132 is coupled to sense voltage on one or more of the feeder lines 106. According to an exemplary embodiment, the voltage sense circuit 132 generates a voltage detection signal based on a first voltage on one feeder line 106 and a second voltage on the other feeder line 106. The voltage detection signal has a characteristic representative of whether line voltage from the power lines 102 is present on one or more of the feeder lines 106. For example, the voltage sense circuit 132 generates the voltage detection signal having a first magnitude when line voltage is present on one or more of the feeder lines 106, and having a second magnitude when line voltage is not present on one or more of the feeder lines 106. The first and second magnitudes of the voltage detection signal may correspond to discrete digital signal levels.

The processing circuit 118 is operably coupled to the voltage sense circuit 132 to receive the voltage detection signal. The processing circuit 118 selectively generates a tamper flag based on whether the voltage detection signal indicates the presence of voltage on one or more of the feeder lines 106 when one or more service disconnect switches 120 has disconnected the power lines 102 from one or more of the feeder lines 106.

The above-described meter 100 thus incorporates the advantages of having the externally accessible actuator 130, namely, to allow for restoration of power after a disconnection by the service disconnect switch that requires customer-side participation. As discussed above, such a requirement enhances safety by effectively preventing the restoration of power by the service disconnect switch when no one is present at the customer's facility. The advantages of the externally accessible actuator are enhanced through the optional use of electronic indicators that signal to the customer that the disconnect switch is armed and that power may be restored.

The above-described meter 100 also provides an improved tamper protection system that requires fewer connections to the digital processing circuitry and preferably isolates the digital processing circuitry from the power lines. In particular, by generating a single voltage detection signal based on the measurement of multiple feeder lines, fewer inputs in a digital processing device need to be dedicated to the operation of that circuit. It will be appreciated that the advantages provided by improved tamper system may be obtained in meters that do not include the externally accessible actuator described above. Similarly, it will be appreciated that the advantages provided by the externally accessible actuator may be obtained in meters that do not include the improved tamper system described above.

While the above-described features provide at least some advantages in any electricity meter that includes a service disconnect switch, further advantages may be obtained through the implementation of such features in a modular electricity meter. FIGS. 2 through 8 show an exemplary embodiment of a modular electricity meter 10 that incorporates several aspects of the present invention.

Figure 2:
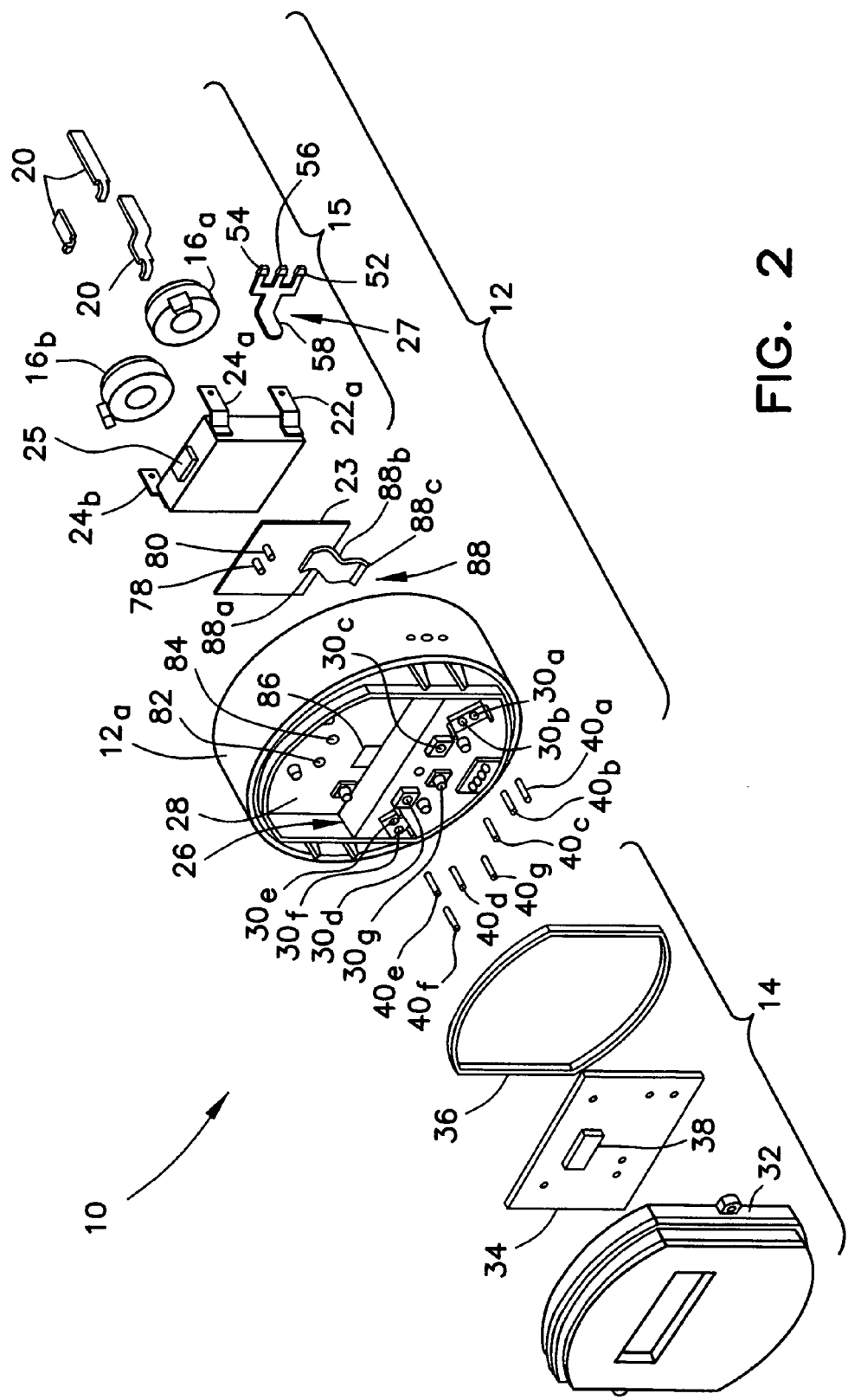
FIG. 2 shows an exploded perspective view of an exemplary embodiment of a modular electricity meter that may incorporate a service disconnect arrangement in accordance with aspects of the present invention.

In particular, FIG. 2 shows an exploded view of a modular meter 10. In general, the meter 10 includes a sensor module 12 and a measurement module 14. The measurement module 14 is constructed such that it may be removably coupled to the sensor module 12. The measurement module 14 and the sensor module 12 cooperate to form a type of revenue meter known in the revenue metering industry as a single-phase meter form. The single-phase meter form is the type typically employed for stand-alone single-family dwellings. It will be noted, however, that the present invention is not limited to single phase metering applications, but may readily be incorporated into polyphase meter forms including, for example the commonly known 1S, 12S, and 25S meter forms.

The sensor module 12 includes voltage and current sensors, which according to the exemplary embodiment described herein, include first and second current transformers 16a and 16b, a plurality of current blades 22a, 22b, 24a, 24b (current blade 22b shown in FIG. 4), and one or more neutral blades 20. The current blades 22a, 22b, 24a, and 24b are secured to the housing of a service disconnect switch 25. As is known in the art the service disconnect switch 25 may suitably be an electrically controlled relay. FIG. 4 shows a perspective view of the service disconnect switch 25 and the current blades 22a, 22b, 24a and 24b in further detail. As shown in FIG. 4, the service disconnect switch 25 includes a housing 60 which houses the actual switching relays, not shown. Extending from the housing are lead wires 62 and connection terminals 64 that provide the control connections to the relays inside of the housing.

In the exemplary embodiment described herein, the service disconnect switch 25 comprises a 200 amp latching relay, such as one commercially available from BLP of the United Kingdom. The latching relay has the characteristic of changing state (closed to open or open to closed) upon receipt of a characteristic input signal, and then retaining the state when the signal is removed, only changing state upon receipt of a different characteristic signal. However, in other embodiments, a normally open or normally closed relay may be employed, although at some loss of efficiency. The use of a 200-amp relay corresponds to the typical 200 amp residential electrical service. Relays having other capacities may be used if desired to accommodate electrical service rated at a different quantity of amps.

Further detail regarding the electrical connections between the current blades 22a, 22b, 24a, and 24b is and the service disconnect switch 25 is provided below in connection with FIG. 6, which shows a schematic diagram of sensor module 12.

Figure 3:
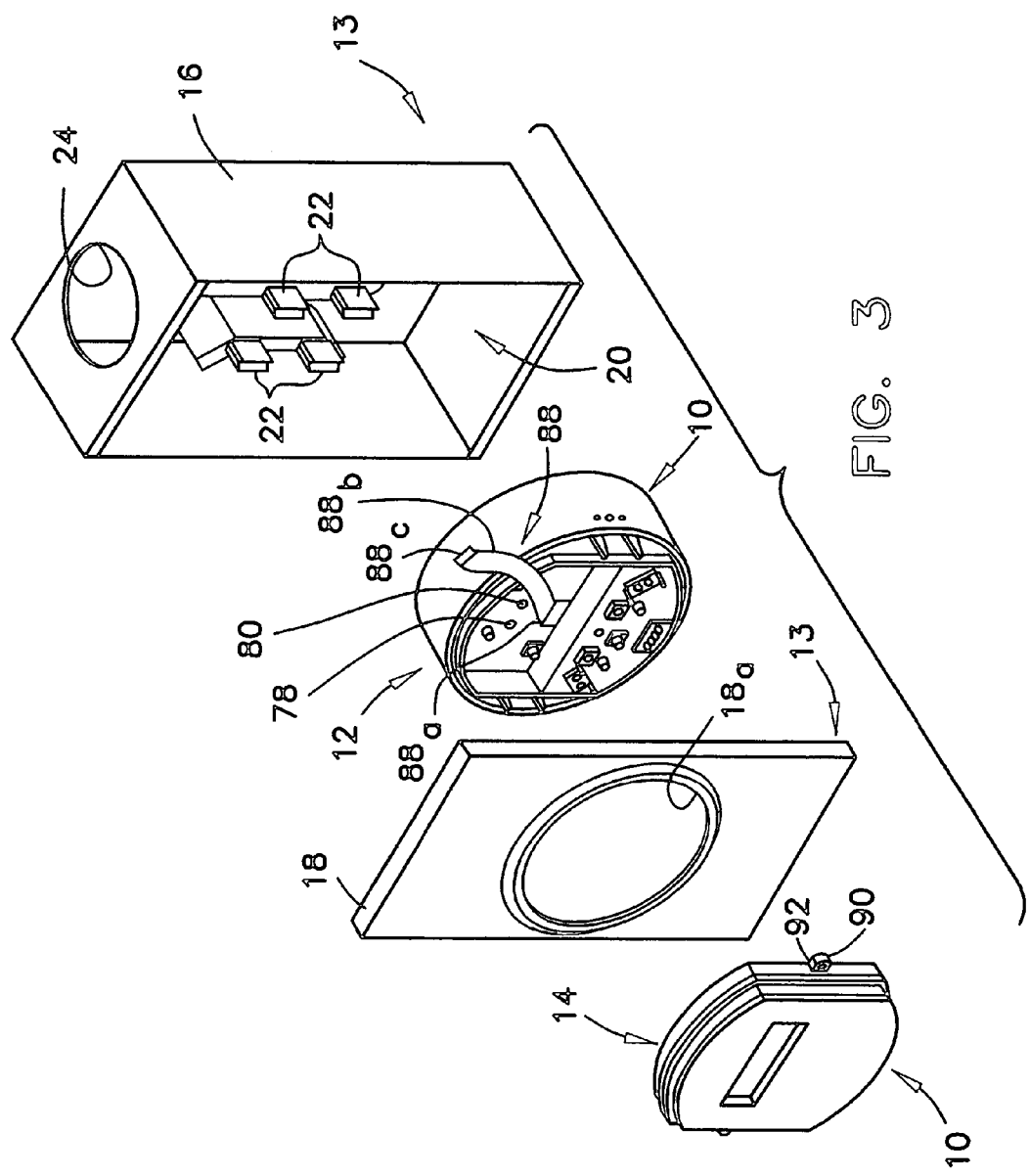
FIG. 3 shows a perspective view of the modular electricity meter of FIG. 2 implemented in an exemplary meter mounting device.

The current blades 22a, 22b, 24a and 24b are configured to be received by jaws of a standard meter mounting device. FIG. 3 shows, among other things, an exemplary meter mounting device including jaws 22 in which the current blades 22a, 22b, 24a and 24b are received.

The first and second current transformers 16a and 16b, respectively, are preferably toroidal transformers having a substantially circular shape defined by a circular core. In the present embodiment, the first current transformer 16a has a turns ratio of N1 and the second current transformer 16b has a turns ratio of N2. The current blade 22a passes through the interior of the toroid formed by the first current transformer 16a and the current blade 22b passes through the interior of the toroid formed by the second current transformer 16b. Accordingly, the current transformers 16a and 16b are in a current sensing relationship with the current blades 22a and 22b, respectively.

Also enclosed within a housing 12a of the sensor module 12 is a driver circuit board 23 and an interface assembly 27. The driver circuit board 23 provides the structure on which is disposed the driver circuit (illustrated in FIG. 7). The driver circuit board 23 includes first and second actuators 78 and 80, discussed in additional detail further below. The driver circuit board 23 further includes a ribbon connector assembly 88. The ribbon connector assembly includes a first connector block 88a secured to the driver circuit board 23, a ribbon connector 88b, and a second connector block 88c for connection to the measurement circuit of the measurement module 14. The interface assembly 27 is a subassembly that includes a plurality of indicators 52, 54, a pushbutton actuator 56, and corresponding lead wires 58.

More specifically, FIG. 5 shows the interface assembly 27 and an underside view of the housing 12a. Referring to FIG. 5, the housing 12a is shown without any of the elements mounted therein for purposes of clarity of exposition of the connection of the interface assembly 27 to the housing 12a. In general, the housing 12a is preferably a molded plastic cylindrical shaped container for receiving the components of the sensor assembly 12 illustrated in FIG. 2. Referring again to FIG. 5, the housing 12a includes, on an inner side thereof, a molded seating structure 66 designed to receive the interface assembly 27 therein. The molded seating structure 66 is integrally molded with the housing 12a proximate the periphery of the housing 12a adjacent apertures 68, 70 and 72. The apertures 68, 70 and 72 provide openings from the interior of the housing 12a through which the indicators 52, 54 may be viewed and through which external access to the actuator 56 is provided.

In particular, when the interface assembly 27 is seated within the molded seating structure 66, the indicators 52, 54 extend partially into or through the apertures 68, 70 respectively and the actuator 56 extends partially through the aperture 72. Because the apertures 68, 70 and 72 provide communication between the interior of the sensor housing 12a and the exterior, arrangements are provided to isolate the interior of the sensor housing 12a from significant exposure to external contaminants, moisture and the like. To this end, the interface assembly 27 includes an elastomeric boot or seal 74 that extends over the actuator 56. The elastomeric seal 74 includes a base 74a that is wedged between a U-shaped switch bracket 76 and one or more sealing washers 79 within the seating structure 66. The actuator 56 and the seal 74 extend at least partially through the aperture 72 to the exterior of the housing 12a. In this position, a person external to the meter 10 may actuate the actuator 56 by depressing the elastomeric seal 74 and actuator 56. The seal 74 and the sealing washers 79 allow for external operation of the movable actuator 56 without exposing the interior of the housing, which includes high voltage and current components, to significant amounts of environmental moisture or contaminants.

To inhibit contamination or moisture ingress through the apertures 68 and 70, first and second sealing lenses 52a and 54a are provided that extend over the indicators 52 and 54, respectively. The lenses 52a and 54a provide the necessary sealing function while also permitting the light from the indicators 52 and 54 to radiate therethrough.

The sensor module 12 further includes an electrically safe interface 26. The electrically safe interface 26 comprises a first interconnecting means for connecting to the measurement module 14. The electrically safe interface 26 also includes means for preventing physical contact of a human operator with potentially hazardous electrical signals present on at least a portion of the voltage and current sensors 15. Signal levels which are considered potentially hazardous are well known. Different levels of potential hazard also exist. For example, signals capable of generating shock currents exceeding 70 milliamperes are possible burn hazards, while signals generating shock currents on the order of 300 milliamperes may constitute life-threatening hazards. Furthermore, signals generating shock currents as low as 0.5 to 5 milliamperes are known to cause an involuntary startle reaction.

In revenue meters, at least some of the sensor devices carry such potentially hazardous electrical signals. Specifically, any portion of a meter that is electrically connected to the voltage and current signals from the power line constitutes a life-threatening hazard. The electricity meter 10 of the present invention isolates the voltage and current sensors by placing them within the meter mounting device 13 and providing the electrically safe interface 26. In the present embodiment, the current blades 22a, 22b, 24a and 24b are directly connected to the facility power line and therefore must be isolated. Although other portions of the sensors 15 may not be directly connected to the power lines, the electrically safe interface 26 preferably prevents human contact with all of the voltage and current sensors 15 as a safety measure.

In the present embodiment, the means for preventing physical contact includes a top plate 28, a plurality of sockets 30a, 30b, 30c, 30d, 30e, 30f and 30g, the actuators 78 and 80 and the connector block 88a of the driver circuit board 23. Each of the sockets 30a through 30g defines an opening in the top plate 28. Two other openings in the top plate 28 include actuator openings 82 and 84 which receive the actuators 78 and 80 from the driver circuit board 23. Yet another opening in the top plate 28 is a connector opening 86 through which the connector block 88a of the driver circuit board 23 extends. Other than the above-described openings, the top plate 28 preferably forms a complete barrier or wall from the measurement module 14 to the voltage and current sensors 15.

At a minimum, the top plate 28 operates to prevent human contact with the portions of the voltage and current sensors 15 that directly contact the power lines of the facility, and in particular, the current blades 22a, 22b, 24a and 24b.

In order to provide a complete barrier, the top plate 28 cooperates with the enclosure base 16 and a cover of a cooperating meter mounting device (See, e.g. FIG. 3) that enclose the voltage and current sensors 15 from the side and bottom. In another alternative embodiment, the top plate 28 may be integrally coupled to such a cover.

Referring again to FIG. 2, the sockets 30a through 30g and their corresponding openings are preferably configured to prevent a human operator from physically contacting the electrically conductive portions of the socket. In particular, the openings defined by the sockets 30a through 30g have sufficiently small proportions to prevent contact of a standard test finger with the electrically conductive portions of the sockets 30a through 30g. A standard test finger is a mechanical device used in the electrical industry to determine whether an electrical connection socket is safe from accidental contact by a human finger. One standard test finger is described in Underwriter's Laboratory, Inc., *Standard for Safety of Information Technology Equipment Including Electrical Equipment Business* UL-1950 (Feb. 26, 1993).

In the present embodiment, the openings defined by the sockets 30a through 30g preferably have a first dimension, for example, the length, and a second dimension, for example, the width, wherein the first dimension has at least the same size as the second dimension, and the second dimension is less than ⅛ inch, thereby preventing substantial access of a human operator through the openings.

As will be discussed below, one of the advantages of the above described sensor module 12 arises from the inclusion of the actuators 78 and 80 that are accessible on the electrically safe interface 26. The electrically safe interface 26 is generally inaccessible to customers and other parties because it is typically covered or closed off by the measurement module 14 when the meter 10 is assembled and operational. Accordingly, the actuators 78 and 80 are accessible only to persons authorized to remove the measurement module 14.

The actuators 78 and 80 in the present embodiment provide signals that can disconnect (open) and arm the service disconnect switch 25. In a device without a separate "armed" state, the actuators 78 and 80 may be coupled directly to the switch 25 to either open or close the switch 25. In any event, the actuators 78 and 80 provide a convenient and intuitive means by which an authorized technician may manipulate the service disconnect switch 25 without allowing customer access to such means.

The measurement module 14 comprises a face cover 32, a printed circuit board 34, and a gasket 36. The printed circuit board 34 includes a display 38, and a measurement circuit. FIG. 8, discussed further below, shows a schematic block diagram of a measurement circuit 42 that may readily be used as the measurement circuit on the printed circuit board 34 of FIG. 2. The measurement circuit is operable to receive measurement signals and generate energy consumption data therefrom. The measurement circuit is operably connected to provide the energy consumption data to the display 38.

The measurement module 14 further includes second interconnecting means operable to cooperate with first interconnecting means (on the sensor module 12) to connect the measurement circuit of the printed circuit board 34 to the voltage and current sensors 15. For example, in the present embodiment, the measurement module 14 includes a plurality of plugs 40a through 40g that are received by the corresponding plurality of sockets 30a through 30g. The plurality of plugs 40a through 40g, when assembled, are electrically connected to the measurement circuit and physically connected to the printed circuit board 34. The printed circuit board 34 further includes a block, not shown, configured to receive the connector block 88c of the connector assembly 88.

FIG. 3 shows an installation configuration that includes the meter 10 and a meter box 13 comprising a housing 16 and a cover 18. The housing 16 is box-like in structure having an opening for receiving the cover 18 and a cabling opening 24 for receiving the power lines of the electrical system being metered, not shown. It will be appreciated that the housing 16 need not be box-like in structure, and that any other suitable shape may be used, as long as there is an opening for receiving a cooperating meter box cover and a cabling opening. The housing 16 further includes an interior 20. Within the interior 20 are located a plurality of jaws 22 constructed of electrically conductive material. When installed into a facility, the plurality of jaws 22 are electrically connected to the power lines of the electrical system of the facility.

The plurality of jaws 22 receive and provide electrical connection to the current blades 22a, 24a, 22b and 24b (see FIG. 2) as well as the neutral blade or blades 20. The relationship of the jaws and the blades 22a, 24a, 22b, and 24b also define the alignment of the sensor module 12 within the housing 16. Once the blades 22a, 24a, 22b, and 24b (see FIG. 2) are engaged with the plurality of jaws 22 (FIG. 3), the sensor module 12 is installed within the interior 20 of the housing 16. The cover 18 is then installed onto the housing 16. The cover 18 includes a meter opening 18a having a perimeter defined by the perimeter of the sensor module 12. Preferably, the perimeter of the meter opening 18a has substantially the same shape and is slightly smaller than the perimeter of the sensor module 12 such that the sensor module 12 cannot be removed when the cover 18 is engaged with the housing 16.

Once the cover 18 is installed, the measurement module 14 in the present embodiment is placed in engagement with the sensor module 12 through the meter opening 18a of the meter box cover 18. Prior to such engagement, the connector block 88c of the ribbon connector assembly 88 is coupled to the corresponding connector, not shown, on the measurement module 14. After connection of the connector block 88c, the measurement module 14 is aligned over the sensor module 12 and then coupled thereto. When in engagement, the plugs 40a through 40g of the measurement module 14 are electrically connected to the sockets 30a through 30g, respectively, of the sensor module 12.

In particular, as discussed above, the top plate 28 includes a plurality of sockets 30a, 30b, 30c, 30e, 30f and 30g. Each socket 30x has an opening for receiving a corresponding plug 40x that is preferably slightly conical to allow for alignment adjustment of the plug 40x during assembly of the measurement module 14 onto the sensor module 12. The socket 30x, which may suitably include a spring loaded terminal, is electrically connected to one of the current blades 24a or 24b for the purposes of obtaining a corresponding phase voltage measurement, as will be more fully discussed below.

Each plug 40*x* is connected to the circuit board 34 and is configured to be inserted the socket 30*x*. The socket 30*x* physically engages the plug 40*x* in such a manner as to provide an electrical connection therebetween. To this end, the plug 40*x* may suitably be an ordinary conductive pin. Further detail regarding the sockets 30*x*, the plugs 40*x*, and an exemplary illustration of their structure and interrelationship may be found in U.S. Pat. No. 5,933,004, which is incorporated herein by reference.

Once the measurement module 14, the cover 18, the sensor module 12, and the housing 16 are all assembled as described above, the meter 10 (i.e., the sensor module 12 and the measurement module 14) performs energy consumption measurements on the electrical system of the facility.

It is noted that the meter 10 preferably includes one or more devices or arrangements that inhibit tampering. As discussed above in connection with FIG. 1, one method of tampering involves bypassing the meter 10 and/or the service disconnect switch 25 in the sensor module 12. Devices for inhibiting such tampering are discussed in further detail below in connection with FIGS. 6, 7 and 8. However, another method of tampering with a modular meter such as the meter 10 is to remove the measurement module 14 so that energy flowing through the sensor module 12 is not recorded in the measurement circuit.

In particular, it is noted that if the measurement module 14 is removed from the sensor module 12, the facility to which the meter 10 is connected will continue to receive electrical power service, but will not be charged for such power usage. The facility will not be charged for such power usage because the billing information is generally obtained from the energy consumption data in the measurement module 14, and the measurement module 14 does not generate any energy consumption data when the measurement module 14 is removed from the sensor module 12. Accordingly, a potential method of meter tampering is to remove the measurement module 14 from the sensor module 12 for a few hours a day, or for one or more days, and then replace the measurement module 14 before utility service provider personnel comes to read the meter.

Exemplary arrangements for preventing such tampering in a modular meter such as the meter 10 are disclosed in U.S. Pat. No. 6,275,168 and U.S. patent application Ser. No. 09/667,888, filed Sep. 22, 2000, both of which are assigned to the assignee of the present invention and are incorporated herein by reference. In the alternative or in addition, electronic arrangements that detect and record removal of the measurement module 14 may be employed, such as that described in U.S. patent application Ser. No. 09/345,696, filed Jun. 30, 1999, which is also incorporated herein by reference. Such arrangements typically generate a mechanical or electronic record indicating that the measurement module 14 has been removed, so that tampering becomes evident to the utility.

The configuration of the meter box 13 in FIG. 3 is a standard mounting device known as a ringless-type mounting device. It will be noted that the meter 10 may readily be adapted for use in a ring-type mounting device as well. A ring-type mounting device differs from the meter box 13 in FIG. 3 in that the sensor module 12 would be installed after the meter box cover 18 is assembled onto the housing 16. An annular ring would then be used to secure the sensor module 12 to the meter box cover 18. To this end, the standard meter box cover for use in a ring type mounting device includes a feature annularly disposed around the opening 18*a* which cooperates with the annular ring to engage and secure the sensor module 12 thereto.

It can thus be seen by reference to FIGS. 2 and 3, that the electrically safe interface 26, when fitted to the meter mounting device housing 16 and the cover 18, provides a substantially solid barrier between a human operator or technician and the current and voltage sensing devices when the measurement module 14 is removed for repair or replacement. The only openings in the interface are of insufficient size to receive a human finger. The openings 82, 84 and 86 are closed off by, respectively, the actuators 78, 80 and the connector block 88*a*. The openings that correspond to the sockets 30*a* through 30*g* are sufficiently small enough, and the sockets are sufficiently recessed within the openings, to prevent an operator from coming into direct contact with dangerous high voltages. In addition, even if the connector block 88*a* is removed, the operator or technician is only exposed to a pin array (see pin array 221 of FIG. 7). In accordance with the exemplary embodiment described herein, the pin array contains only non-hazardous voltages, preferably isolated from the utility power lines (see pin array 221 of FIG. 7).

It will be appreciated that other interconnection means may be employed in the sensor module 12 and measurement module 14 that will also provide an electrically safe interface. For example, wireless means may be used as the interconnection means. Such wireless means could provide voltage and current measurement signals from the sensor module 12 to the measurement module 14. For example, the measurement module 14 could include sensitive electric and magnetic field sensors that obtain voltage and current measurement information from electromagnetic radiation from the current and voltage sensors 15. Likewise, optical communication means may be used to provide measurement signal information from the sensor module 12 to the measurement module 14. In any case, the electrically safe interface would typically include a barrier such as the top plate 28 that prevents physical access by a human operator to the dangerous portions of the voltage and current sensors 15 when the measurement module 14 is removed.

To fully obtain the benefits of modularity, it is necessary to address calibration issues in the design of the meter assembly 10. Specifically, the sensor module 12 preferably has a calibration feature that allows it to be used in connection with any suitable measurement module.

By contrast, in traditional meters where the sensor circuit and the measurement electronics are housed together as a single unit, the measurement circuit is often specifically calibrated for use with a particular voltage and current sensors. The reason for the specific calibration is that there can be significant error in signal response of each voltage and current sensors. In particular, the current sensing devices, such as current transformers, often have a widely variable signal response error. In other words, the signal response error of any two current sensing devices can vary to a significant degree. The signal response error of commonly available current transformers affects both magnitude and phase response.

The signal response error of such current transformers typically exceeds the amount of energy measurement error that can be tolerated in the meter. In other words, while the current transformer signal response error may reach as much as 10%, the measurement error of the meter must be much less than 10%. Accordingly, compensation must be made for the variance, or tolerance, of the current sensing devices to ensure that the ultimate energy measurement accuracy of the meter is within acceptable tolerances. The compensation is typically carried out in the prior art by adjusting or calibrating the measurement circuit during manufacture to account for the signal response characteristics of the current sensing devices that will be used in a particular meter unit. In other words, each measurement circuit is custom-calibrated for each meter.

The meter assembly 10, however, should not require such extensive unit-specific calibration. In other words, the sensor module 12 should be able to receive any of a plurality of measurement meters 14 without extensive calibration operations. Accordingly, referring again to FIG. 2, the sensor module 12 is pre-calibrated for modularity, such that the sensor module 12 may be coupled with any measurement module 14 without requiring unit-specific calibration of that measurement module 14.

To this end, the sensor module 12, and specifically the voltage and current sensors 15 are pre-calibrated such that the voltage and current sensors 15 have a signal response within a tolerance of a predefined signal response that is no greater than the tolerance of the energy measurement accuracy of the meter assembly 10. The energy measurement accuracy of the meter assembly 10 may be defined as the accuracy of the measured energy consumption with respect to the actual energy consumption of the facility. Thus, if the tolerance of the energy measurement accuracy of the meter is required to be 0.5%, then the difference between the measured energy consumption and the actual energy consumption will not exceed 0.5%. In such a case, the tolerance of the signal response of the voltage and current sensors will be no more than, and typically substantially better than, 0.5%. As a result, the measurement module 14 may readily be replaced with another measurement module without requiring specific calibration of the replacement measurement module.

The pre-calibration of the voltage and current sensors 15 may be accomplished using careful manufacturing processes. The primary source of variance in the signal response of the voltage and current sensors 15 is the signal response of the current transformers 16a and 16b. Generally available current transformers are prone to variance in both magnitude and phase angle signal response. Accordingly, pre-calibration involves using current transformers that are manufactured to perform within the required tolerances. As an initial matter, the current transformers 16a and 16b are manufactured using a high permeability core material, which reduces phase angle variance in the signal response. Moreover, the current transformers 16a and 16b are manufactured such that the actual number of turns is closely controlled. Close manufacturing control over the number of turns in the current transformers 16a and 16b produces sufficient consistency in the magnitude signal response to allow for interchangeability.

Alternatively, if controlling the number of turns during initial manufacturing is not desirable for cost reasons, then turns may be added or removed after manufacturing to achieve the desired signal response. For example, it may be more cost effective to buy wide tolerance commercially available current transformers and adjust the number of turns than to have sufficiently narrow tolerance current transformers specially manufactured.

Still another method of obtaining calibration would be to use inexpensive wide tolerance current sensing devices and then store calibration information directly in the sensor module 12 that may be communicated to each measurement module 14 as it is connected. Such an arrangement in a modular meter is described in U.S. patent application Ser. No. 60/325,030, filed Sep. 25, 2001, which is incorporated herein by reference.

Figure 6:
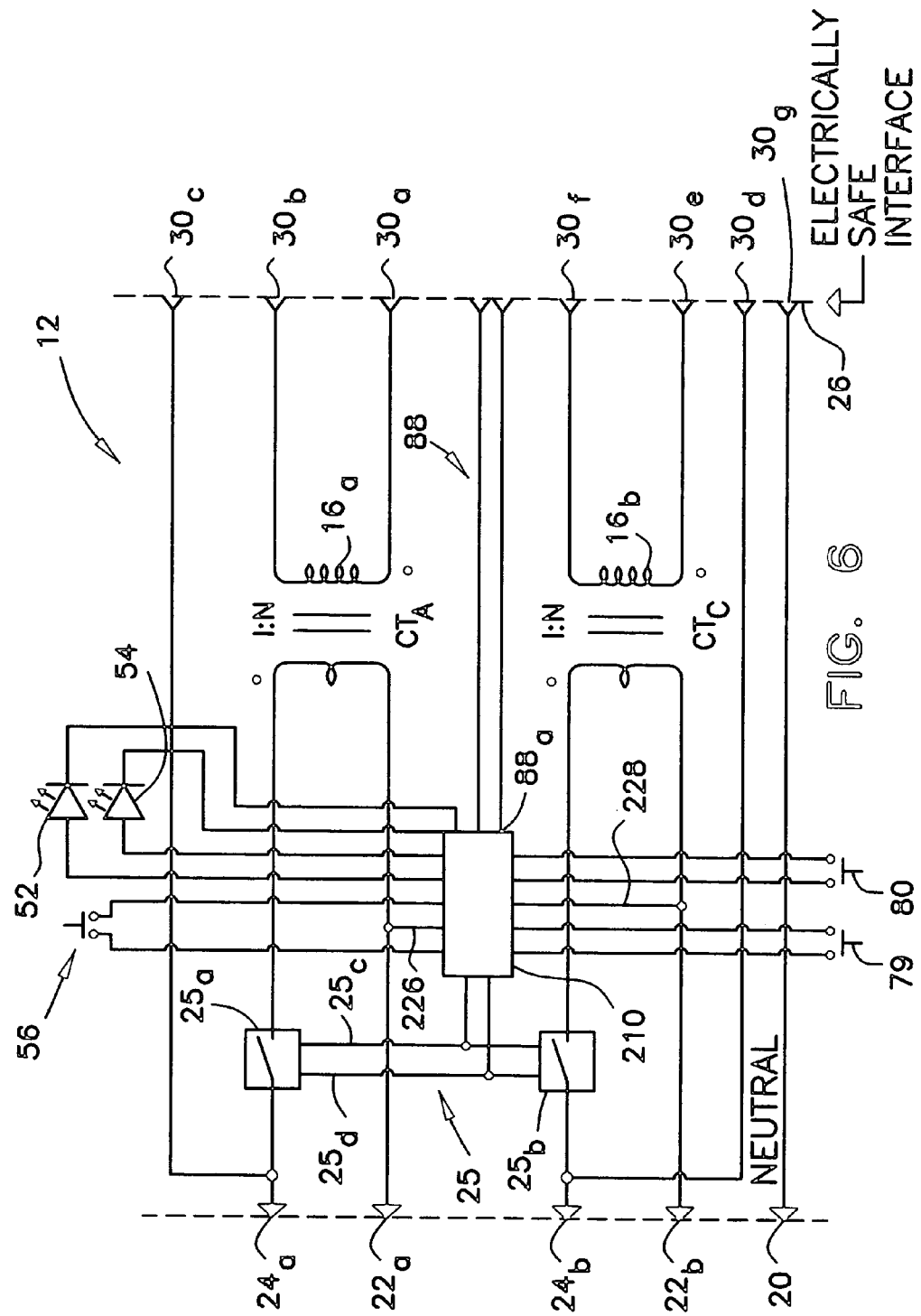
FIG. 6 shows a schematic diagram of the sensor module of the modular electricity meter of FIG. 2.

Referring now to the circuit block diagram in FIG. 6 of the sensor module 12 of FIG. 2, the sockets 30a and 30b provide a connection to the first current transformer 16a, the sockets 30e and 30f provide a connection to the second current transformer 16b, the socket 30c provides a connection to the current blade 24a, the socket 30d provides a connection to the current blade 24b, and the socket 30g provides a connection to one or more of the neutral blades 20.

The sensor module 12 further includes the service disconnect switch 25. As shown herein, the service disconnect switch 25 includes a first switching contact 25a and a second switching contact 25b. The service disconnect switch further includes control signal lines 25c and 25d that are operably coupled to the driver circuit 210.

In an ordinary residential "single phase" meter, the current blade 24a connects to a first high side of a 240-volt incoming utility power line and the current blade 24b connects to a second high side of the 240-volt incoming utility power line. The utility current blade 24a connects through the first switching contacts 25a to a first feeder line of the customer load via the current blade 22a. Similarly, the utility current blade 24b connects through the second switching contacts 25b to a second feeder line of the customer load via the current blade 22b. The current transformer 16a is disposed in a current sensing relationship with the current flowing to the first feeder line through the current blade 22a. The current transformer 16b is disposed in a current sensing relationship with the current flowing through the second feeder line through the current blade 22b.

The driver circuit 210 is operably coupled to communicate to an external device, and namely, the measurement module 14, through the connector ribbon assembly 88. The driver circuit 210 is further connected to provide control signals the switching contacts via signal lines 25c and 25d. The driver circuit 210 is operably connected to controllably energize the indicators 52 and 54, and to detect actuation of any of the actuators 56, 78 and 80.

Figure 7:
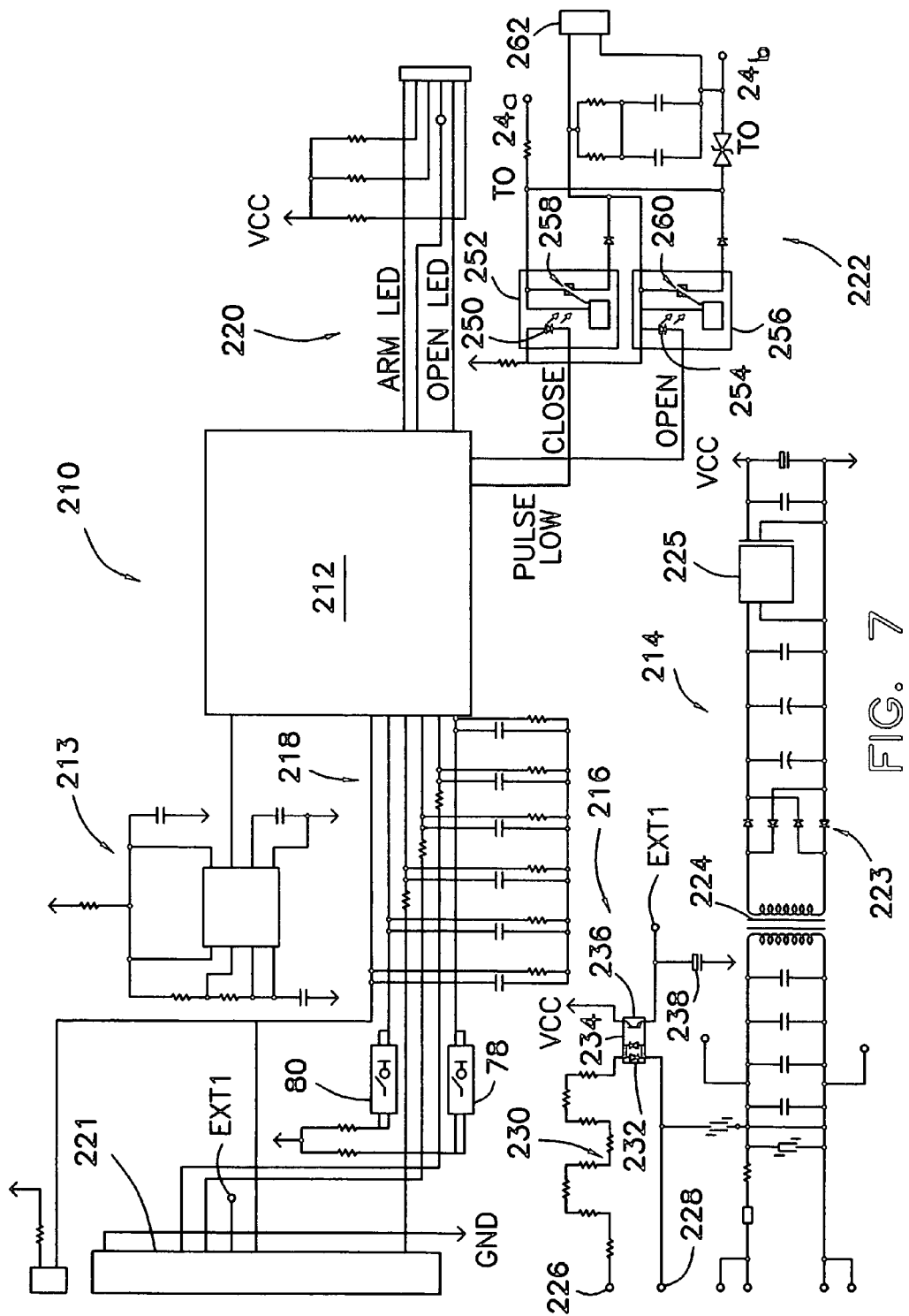
FIG. 7 shows a schematic diagram of the driver circuit of the sensor module of FIG. 6.

FIG. 7 shows in further detail a schematic of the elements of the driver circuit board 23 including primarily the driver circuit 210. In addition to the driver circuit 210, as discussed above in connection with FIG. 2, the driver circuit board 23 further includes the actuators 78 and 80 and the connector block 88a.

The driver circuit 210 includes a digital control circuit 212, timer/clock circuitry 213, a power supply circuit 214, a voltage sense circuit 216, I/O interface circuitry 218, external interface drive circuitry 220 and disconnect switch drive circuitry 222.

The power supply circuit 214 is preferably coupled to the current blades 24a and 24b to obtain external power even when the service disconnect switch 25 is open (in the disconnected state or armed state). The power supply circuit includes a transformer 224, a diode bridge circuit 223, and regulator circuit 225 configured as is well known in the art to provide a DC power supply output voltage VCC derived from an AC input voltage.

The voltage sense circuit 216 is a circuit operably coupled to sense whether line voltage is present on the feeder lines of the customer load. To this end, the voltage sense circuit 216 includes inputs 226 and 228 electrically connected to the current blades 22a and 22b (see FIG. 6) to obtain any voltages present in the feeder lines to the customer load. The input 226 connects to the input 228 through a resistive network 230 and a bi-directional input 232 of an optical isolation circuit 234. As a result, a voltage divider is formed at the input 232 of the optical isolation circuit 234 by the resistive network 230 and the inherent impedance of the bi-directional input 232.

It will be appreciated that the resistive network 230 may suitably be one or many resistors, so long as the total resistance value is selected to provide an appropriate amount of drop over the bi-directional input 232 at a relatively low current. Moreover, it will be noted that an additional resistor may be coupled across the bi-directional input 232 if necessary to reduce the drop over the bi-directional input 232.

The optical receiver/output 236 of the optical isolation circuit 234 is coupled between the power supply voltage VCC and an output EXT1 of the connector block 88a. A capacitor 238 is coupled between the output EXT1 and ground. Accordingly, when the input 232 of the optical isolation is biased on, then the optical receiver/output 236 propagates the VCC supply voltage (logic high) to the output EXT1, also charging the capacitor 238. When the input 232 is not biased on, then the optical receiver/output 236 opens the connection between the VCC supply voltage and the output EXT1. The capacitor 238 discharges and then little or no voltage (logic low) propagates to the output EXT1. In general, the output EXT1 is provided to the processing circuitry in the measurement module 14 to aid in the detection of a form of tampering in which the sensor module 12 and/or the disconnect switch 25 is bypassed.

The timer/clock circuitry 213 comprises timer circuitry that provides clocking signals to the digital control circuit 212. Such devices are well known. The I/O interface circuitry 218 provides buffer circuitry that allows the digital control circuit 212 to receive input from and provide output to various devices. For example, the I/O interface 218 allows for a bi-directional serial data communication line to the processing circuitry of the measurement module 14 through the connector block 88a. The I/O interface 218 also operably provides the digital control signal 212 with a signal representative of the status of the actuators 78 and 80. The external interface drive circuitry 220 provides the drive circuitry necessary to cause the indicators 52, 54, which in the exemplary embodiment described herein are light emitting diodes ("LEDs"), to illuminate in response to appropriate digital output signals generated by the digital control circuit 212. The external interface drive circuitry 220 further enables the digital control circuit 212 to obtain a digital signal representative of the status of the actuator 56.

The disconnect switch drive circuit 222 includes circuitry that enables the digital control circuit 212 to cause the switch contacts 25a and 25b to open and close. In particular, the digital control circuit 212 includes a CLOSE output and an OPEN output. The CLOSE output is coupled to the input/transmitter 250 of an optical isolation circuit 252 and the OPEN output is coupled to the input/transmitter 254 of an optical isolation circuit 256. The output/receivers 258, 260 of the optical isolation circuits 252, 256 respectively, are coupled to first and second AC power line voltages (i.e. the line voltages on current blades 24a and 24b) in a manner configured to generate relatively high power control signals at an output connector 262. For example, the output/receiver 258 allows AC power line current to flow temporarily to the connector 262 and the output/receiver 260 allows AC power line current to flow temporarily from the connector 262. The output connector 262 is coupled to the control lines 25c and 25d of the disconnect switch 25.

In general, the disconnect switch drive circuit 222 operates to provide the AC power line control signal to the control lines 25c and 25d that signal causes the switch contacts 25a and 25b to open responsive to a logic high signal on the OPEN output of the digital control circuit 212. The disconnect drive circuit 22 further operates to provide the AC power line control signal to the control lines 25c and 25d that causes the switch contacts 25a and 25b to close responsive to a logic high signal on the CLOSE output of the digital control circuit 212.

The digital control circuit 212 may suitably comprise a processor or one or more programmable logic devices operably to carry out basic logical functions in the control of the service disconnect switch 25, and the indicators 52 and 54. The digital control circuit 212 and the service disconnect switch 25 form a service disconnect circuit having a disconnected state, an armed state, and a connected state. The digital control circuit 212 generally controls the change of states of the circuit and the outputs generated as a result of such changes in state.

In particular, the digital control circuit 212 is operable to change from the connected state to the disconnected state, from the disconnected state to the armed state, and from the armed state to the connected state. In general, the digital control circuit 212 causes the switch contacts 25a and 25b to be open when transitioning into the disconnected state, thereby disconnecting the electrical service to the load. The digital control circuit 212 further causes the switch contacts 25a and 25b to be closed, thereby restoring service to the load when transitioning from the armed state to the connected state. In the armed state, the digital control circuit 212 leaves the switch contacts 25a and 25b open.

The digital control circuit 212 changes state in response to variety of inputs. In general, the digital control circuit 212 changes from the connected state to the disconnected state in response to serial communication signals received from the processing circuit of the measurement module 14 (i.e. the processor or controller 48 of FIG. 8) through the connector block 88a. The digital control circuit 212 also changes from the connected state to the disconnected state in response to actuation of the actuator 78, which operates as a disconnect switch. In response to the change from the connected state to the disconnected state, the digital control circuit 212 generates a logic high signal on its OPEN output, thereby causing the switch contacts 25a and 25b to open. In addition, the digital control circuit 212 generates a logic high signal on the output that causes the indicator 52 to become illuminated. Finally, the digital control circuit 212 generates a signal identifying the change in state to the processor 48 of the measurement module 14 via the connector block 88a.

The digital control circuit 212 changes from the disconnected state to the armed state in response to serial communication signals received from the processor 48 of the measurement module 14 through the connector block 88a. The digital control circuit 212 also changes from the disconnected state to the armed state in response to actuation of the actuator 80, which operates as an arm switch. In response to the change from the disconnected state to the armed state, the digital control circuit 212 generates a logic high signal on the output that causes the indicator 54 to become illuminated, and further stops generating the logic high signal on the output that causes the indicator 52 to be illuminated. In addition, the digital control circuit 212 generates a signal identifying the change in state to the processor 48 of the measurement module 14 via the connector block 88a.

The digital control circuit 212 changes from the armed state to the connected state in response to serial communication signals received from the processor 48 of the measurement module 14 through the connector block 88a. The digital control circuit 212 also changes from the armed state to the connected state in response to actuation of the actuator 56, which operates as a connect switch. In response to the change from the armed state to the connected state, the digital control circuit 212 generates a logic high signal on its CLOSE output, thereby causing the switch contacts 25a and 25b to close. In addition, the digital control circuit 212 stops generating the logic high signal on the output that causes the indicator 52 to become illuminated. Finally, the digital control circuit 212 generates a signal identifying the change in state to the processor 48 of the measurement module 14 via the connector block 88a.

The digital control circuit 212 may also monitor the mechanical position of the switch 25 in an independent manner. In particular, the digital control circuit 212 may include a connection through the switch contacts 25a and/or 25b which provide the digital control circuit 212 with feedback as to the physical position of the switch contacts 25a and 25b. In this manner, the digital control circuit 212 may ensure that the switch 25 is operating properly.

FIG. 8 shows a circuit block diagram of the measurement circuit 42 and associated display 38 for use in the measurement module 14. The measurement circuit 42 includes a watt measurement integrated circuit ("IC") 44, a controller or processor 48, a non-volatile memory 50 and one or more communication circuits 51. Plugs 40a, 40b, 40c, 40d, 40e, and 40f are each connected to the watt measurement IC 44 through various input circuits. In particular, the plugs 40a and 40b are connected to the watt measurement IC 44 through a current input circuit 312, the plugs 40e and 40f are connected to the watt measurement IC 44 through a current input circuit 314, the plug 40c is connected to the watt measurement IC 44 through a voltage input circuit 316, and the plug 40d is connected to the watt measurement IC 44 through a voltage input circuit 318.

The current input circuit 312 is a device configured to obtain a scaled signal indicative of the line current waveform on the first feeder line. To this end, the current input circuit 312 is connected across a line resistor RLA1 that is series connected between the plug 40a and the plug 40b. Plugs 40a and 40b, as discussed above and shown in FIGS. 2 and 8, are electrically connected to the first current transformer 16a of the sensor module 12. Similarly, the current input circuit 314 is a device configured to obtain a scaled signal indicative of the line current waveform on the second feeder line. To this end, the current input circuit 314 is connected across a line resistor RLA2 that is series connected between the plug 40e and the plug 40f. Plugs 40e and 40f, analogous to plugs 40a and 40b, are electrically connected to the second current transformer 16b of the sensor module 12. The outputs of the current input circuits 312 and 314 are provided to the watt measurement IC 44.

The voltage input circuit 316 is a voltage divider network tapped off of the connection to plug 40c. Similarly, the input circuit 318 is a voltage divider network tapped off of the connection to the plug 40d. The power supply 49 is a device that receives AC input line voltage and generates a DC supply voltage VDD therefrom. Such power supplies are well known in the art. The power input to the power supply 49 is preferably tapped off of the connection to the plug 40d. The outputs of the voltage input circuits 316 and 318 are provided to the watt measurement IC 44.

The watt measurement IC 44 is a device that receives measurement signals representative of voltage and current signals in an electrical system and generates energy consumption data therefrom. In the exemplary embodiment described herein, the watt measurement IC 44 may suitably be the conversion circuit 106 described in U.S. Pat. No. 6,112,158 or the conversion circuit 106 described in U.S. Pat. No. 6,112,159, both of which are assigned to the assignee of the present invention and incorporated herein by reference.

Alternatively, the watt measurement IC 44 may be replaced by one or more discrete circuits capable of carrying out the same function of generating energy consumption information from the voltage and current measurement signals. For example, the watt measurement IC 44 may suitably be replaced by the first and second watt measurement ICs 44 and 46 described in the U.S. Pat. No. 5,933,004, which is incorporated herein by reference.

In any event, the watt measurement IC 44 is further operably connected to the microcontroller 48 through a bus structure 320. The bus structure 320 consists of one or more serial and or parallel busses that allow for data communication between the microcontroller 48 and the watt measurement IC 44. In general, the watt measurement IC 44 provides energy consumption data to the microcontroller 48 and the microcontroller 48 provides control and calibration data to the watt measurement IC 44.

The microcontroller 48 is further operably connected to the memory 50, the communication circuit(s) 51, and the display circuit 38. The processor 48 is also operably coupled to communicate with the sensor module 12, and more particularly, the digital control circuit 212 of the service disconnect switch circuit (See FIGS. 6, 7) using serial data signals. To effect such communication, the processor 48 is operably coupled to communicate such signals through the connector block 88c.

In the operation of the exemplary meter assembly 10 illustrated in FIGS. 2-8, energy consumption measurements are carried out in the following manner. As discussed above, the present embodiment is intended for use with a wiring configuration commonly referred to in the industry as a single-phase three-wire configuration. A single phase three-wire configuration, as discussed above, typically includes a 240 volt line that is bisected into two 120 volt lines for use by the load, referred to herein as the First line and the Second line. The present invention, however, is in no way limited to use in single-phase configurations. The concepts described herein may readily be implemented in meters used in other configurations, including polyphase configurations.

In operation, the plurality of jaws 22 provide the first bisected power line or First line signal across the blades 22a and 24a through the switch contact 25a (see FIGS. 2, 3 and 6). Similarly, the plurality of jaws 22 provide the second bisected power line or Second line signal across the blades 22b and 24b through the switch contact 25b (see FIGS. 2, 3 and 6). Referring to FIG. 6, the First line current flows from the blade 24a through the switch contact 25a to the blade 22a. The current blade 22a, which passes through the current transformer 16a, imposes a scaled version of the current, referred to herein as the first current measurement signal, on the first current transformer 16a. The first current measurement signal is approximately equal to the current flowing through the current blade 22a scaled by a factor of N1, where N1 is the turns ratio of the current transformer 16a. The first current measurement signal is provided to the sockets 30a and 30b. The first contact blade 24a is further provides the first voltage measurement signal (i.e. the actual voltage of the First line) to the socket 30c.

Similar to the First line current, the Second line current flows from the blade 24b through the switch contact 25b to the current blade 22b. The current blade 22b, which passes through the second current transformer 16b, imposes a scaled version of the Second line current onto the second current transformer 16b, thereby causing the second current transformer 16*b* to generate a second current measurement signal. The second current measurement signal is approximately equal to the Second line current scaled by a factor of N2, where N2 is the turns ratio of the second current transformer 16*b*. The turn ratios N1 and N2 of the current transformers 16*a* and 16*b*, respectively, are typically substantially similar and preferably equal. However, manufacturing tolerances may result in slight differences in the turn ratios N1 and N2. In any event, the second current transformer 16*b* provides the second current measurement signal to the sockets 30*e* and 30*f*. The blade 24*b* also provides the second voltage measurement signal (i.e. the actual voltage line signal) to the socket 30*d*. The neutral blade 20 provides a connection between the neutral power line and the socket 30*g*.

It is noted that potentially hazardous electrical signals reside on one or more of the sockets 30*a* through 30*g*. In particular, the sockets 30*c* and 30*d* provide a direct connection to the external or utility power line, and therefore are potentially extremely dangerous. Moreover, the sockets 30*a*, 30*b*, 30*e*, and 30*f* all include current measurement signals that are potentially dangerous to humans, depending somewhat on the overall power consumption of the facility being metered and the turn ratios N1 and N2. Accordingly, the relatively small physical size of the sockets 30*a* through 30*g* and their corresponding openings greatly inhibits and preferably prevents human contact with the socket connections.

Continuing with the general operation of the meter 10, the sockets 30*a* and 30*b* (FIG. 6) provide the first current measurement signal to the plugs 40*a* and 40*b*, respectively, of the measurement module 14 (FIG. 8). Likewise, the sockets 30*e* and 30*f* (FIG. 6) provide the second current measurement signal to the plugs 40*e* and 40*f*, respectively, of the measurement module 14 (FIG. 8). The sockets 30*c* and 30*d* (FIG. 6), provide, respectively, the first and second voltage measurement signals to the plugs 40*c* and 40*d* (FIG. 8). The neutral socket 30*g* (FIG. 6) provides a neutral connection to the plug 40*g* of FIG. 8.

Referring again to FIG. 8, at least the basic metering functions are provided by the measurement circuit 42 within the measurement module 14. It will be noted, however, that the "basic metering functions" of the measurement circuit 42 may include far more than simple energy measurement functions. For example, the basic metering functions provided by the measurement circuit 42 may include at least a part of one or more advanced features typically associated with electricity meters, such as time of use metering, load profiling, demand metering, as well as other features such as service type recognition, diagnostics, remote meter reading communications or the like.

In any event, the plugs 40*a* and 40*b* provide the first current measurement signal to the watt measurement IC 44 through the current input circuit 312. The current input circuit 312 preferably converts the first current measurement signal to a voltage signal having a magnitude and phase that is representative of the First line current. The socket 40*c* provides the first voltage measurement signal through the voltage input circuit 316 to the watt measurement IC 44.

The plugs 40*e* and 40*f* similarly provide the second current measurement signal to the watt measurement IC 44 through the current input circuit 314. The current input circuit 314 preferably converts the second current measurement signal to a voltage signal having a magnitude and phase that is representative of the Second line current. The socket 40*d* provides the second voltage measurement signal through the voltage input circuit 318 to the watt measurement IC 44. The socket 40*d* further provides the Second line voltage to the power supply 49. The power supply 49 is further connected to the neutral plug 40*g* and operates to provide a supply voltage VDD to each of the functional block circuits within the measurement module 14.

The watt measurement IC 44 receives the voltage and current measurement signals, and generates energy consumption data therefrom. To this end, the watt measurement IC 44 preferably samples, multiplies and accumulates the measurement signals as is known in the art to generate watt data, VA data, and/or VAR data. See, for example, U.S. Pat. No. 6,112,158 or U.S. Pat. No. 6,112,159, as discussed above, for a description of such operations.

The processor 48 then obtains watt data, VA data, and/or VAR data and further processes the data to provide energy consumption information in standard units in accordance with metering industry standards. The energy consumption information is communicated externally through the display 38. Alternatively or additionally, the energy consumption information may be communicated through the external communication circuit 51.

It is noted that in the exemplary embodiment described herein, the meter 10 is a type of meter commonly known in the industry as a self-contained meter. In a self-contained meter, the current coils of the meter, such as current blades 22*a* and 22*b* of the present embodiment, carry the entire current load of the electrical system. As a result, in a typical meter, if the meter is removed for repair or replacement, the current coils are removed from the jaws of the meter box, and power to the facility is interrupted. A distinct advantage of the present invention is that the measurement module 14 may be removed for repair, replacement or upgrade without removing the current coils of the meter. As a result, the facility experiences no electrical service interruption during the replacement.

Automated Operation of Service Disconnect Circuit

As discussed further above, it may be advantageous in some circumstances to disconnect electrical service to the load connected to the meter 10. For example, an electrical service provider may employ remote disconnection of service to periodically disconnect the load for delinquent payors. To this end, disconnection and arm signals may be received from the service provider's systems via the communication circuits 51. In such a case, the communication circuit(s) 51 may include a telephone modem, power line carrier communication circuit, and/or a radio communication circuit. In an alternative embodiment, it may be advantageous to disconnect electrical service to a load in a prepaid energy system. The disconnection would be employed when the prepaid energy quantity was consumed. In such a case, the controller or processor 48 may automatically track consumption of prepaid amounts and disconnect service when appropriate. In another alternative, the processor 48 may automatically cause electrical service to be disconnected in response to energy rationing processes enabled within the processor 48.

Regardless of whether the processor 48 receives service disconnect circuit control signals from an external device or internally generates such control signals, the processor 48 provides corresponding disconnect control signals to the digital control circuit 212 (see FIGS. 6, 7, and 8) via the connectors 88*c* and 88*a*.

The digital control circuit 212 changes from the connected state to the disconnected state upon receiving the disconnect control signal from the processor 48. During the state change, the digital control circuit 212 operates as discussed above in connection with FIG. 7 to cause the switch contacts 25a and 25b to open and to cause the indicator 52 to be illuminated. The illuminated indicator 52 provides the customer (or other party) with a visual indication that service has been disconnected via the service disconnect circuit of the meter 10.

At some subsequent time, the processor 48 will provide an arm command signal to the digital control circuit 212. For example, the processor 48 may be programmed to allow reconnection of electrical service after a brief interruption of service, upon full or partial payment of amounts due, or upon subsequent prepurchase of additional energy. To allow reconnection of the electrical service to the load, the processor provides the arm control signal to the digital control circuit 212 of the service disconnect circuit through the connectors 88a and 88c.

As discussed above, the digital control circuit 212 changes from the disconnected state to the armed state upon receiving the arm command signal from the processor 48. The digital control circuit 212 operates as discussed above in connection with FIG. 7 to illuminate the indicator 54. The illuminated indicator 54 provides the customer (or other party) with a visual indication that service may now be re-connected because the service disconnect circuit of the meter 10 has been armed.

In accordance with one aspect of the present invention, the digital control circuit 212 may only be changed from the armed state to the connected state through actuation of the actuator 56. In this manner, the dangers associated with remote or automatic reconnection of electrical service may be avoided. Moreover, the customer may avoid additional unnecessarily costs of electricity consumption by having the choice of whether to reconnect.

It is noted that in some prepaid energy situations, a smart card or debit card may be inserted into a device that communicates with the meter locally. In such a case, the acceptance of prepayment could cause the digital control circuit 212 to change to the armed state and connected state immediately.

However, in a normal situation which requires actuation of the connect actuator 56, the digital control circuit 212 detects the actuation and changes from the armed state to the connected state. The digital control circuit 212 operates as discussed above in connection with FIG. 7 to close the switch contacts 25a and 25b. When the switch contacts 25a and 25b are closed, then electrical power flows to the load connected to the blades 22a and 22b from the power lines connected to the blades 24a and 24b.

Manual Operation of Service Disconnect Circuit

In some circumstances, it may be advantageous to allow a technician the ability to disconnect electrical service to the load connected to the meter 10 using the service disconnect circuit. To this end, the meter 10 includes disconnect and arm switches in the forms of actuators 78 and 80. However, the actuators 78 and 80 are not accessible to the customer because the measurement module 14 inhibits such access when installed on the sensor module 12 (see FIGS. 1 and 2).

In order to access the actuators 78 and 80, the measurement module 14 must be removed from the sensor module 12. Such removal typically causes a tamper event to occur. For example, removal of the measurement module 14 may require compromise of a mechanical tamper seal that can only be replaced by a qualified technician. Thus, access to the actuators 78 and 80 is effectively limited to qualified technicians.

In the event that a technician needs to perform an operation in which the technician needs to either disconnect or reconnect the electrical service, the technician first removes the measurement module 14 from the sensor module 12. The technician then actuates the disconnect switch 78 if disconnection of service is desired or the arm switch 80 if reconnection of service is desired. In the case of reconnection, the technician would further actuate the connect switch 56 to cause power to be connected.

In further detail, when the technician actuates the disconnect switch 78, the digital control circuit 212 detects the actuation and changes from the connected state to the disconnected state in response thereto. The digital control circuit 212 operates as discussed above in connection with FIG. 7 to cause the switch contacts 25a and 25b to open and to cause the indicator 52 to be illuminated. The indicator 52 provides the technician with a visual indication that service has been disconnected via the service disconnect circuit of the meter 10.

When the technician actuates the arm switch 80, the digital control circuit 212 detects the actuation and changes from the disconnected state to the armed state in response thereto. The digital control circuit 212 operates as discussed above in connection with FIG. 7 to illuminate the indicator 54. The indicator 54 provides the technician with a visual indication that service may now be re-connected because the service disconnect circuit of the meter 10 has been armed.

When the technician (or other party) actuates the connect actuator 56, the digital control circuit 212 detects the actuation and changes from the armed state to the connected state. The digital control circuit 212 operates as discussed above in connection with FIG. 7 to close the switch contacts 25a and 25b. When the switch contacts 25a and 25b are closed, then electrical power flows to the load connected to the blades 22a and 22b from the power lines connected to the blades 24a and 24b.

The technician may cycle through multiple disconnection and reconnection operations, as desired, before replacing the measurement module 14.

Bypass Tamper Protection

As discussed above, one method of tampering that can defeat the operation of the service disconnect circuit of the meter 10 consists of implementing a bypass connection in parallel to the service disconnect switch contacts 25a and/or 25b. In accordance with one aspect of the present invention, the processor 48 of the measurement module 14 cooperates with the voltage sense circuit 216 of the driver circuit 210 to sense such bypass connections.

In general, the voltage sense circuit 216 is operable to provide a logic signal that is representative of whether line voltage is present on the feeder lines to the customer's load. Referring to FIGS. 6 and 7, when line voltage is present on the feeder lines, line voltage is also present on the blades 22a and 22b. The voltage sense circuit inputs 226 and 228 are electrically coupled to and thus obtain the line voltage from the blades 22a and 22b. The resistor network 230 of the voltage sense circuit 216 divides the line voltage and provides the divided line voltage to the optical isolator bi-directional input 232. The divided line voltage, which has a normal 50 or 60 Hz cycle, causes the one of two diodes of the bi-directional input 232 to be biased on through the entire AC cycle of the line voltage, except for the portions of the AC cycle directly adjacent to the zero crossings.

Because the bi-directional input 232 is biased on in such a manner, the receiver/output 236 causes VCC to be connected to the output EXT1 through most of the AC cycle. Moreover, during the short time near the zero crossings of the AC cycle in which the bi-directional input 232 is biased off, the capacitor 238 sustains the high logic level at EXT1. Thus, EXT1 remains at a constant high logic state while line voltage is present on the blades 22a and 22b.

When line voltage is not present on the feeder lines, then no voltage is present on the blades 22a and 22b, nor the voltage sense input circuits 226 and 228. As a result, the bi-directional input 232 is biased off and, as a result, the receiver/output 236 does not connect VCC to the output EXT1.

The processor 48 uses the EXT1 output and the state of the service disconnect switch 25 to determine whether a tamper event has occurred. If the service disconnect switch 25 is open and EXT1 is at a high logic level, then the processor 48 records a tamper event. It will be apparent that when the service disconnect switch 25 is closed, EXT1 will be at a high logic level because line voltage is present at the load. However, no tamper event is recorded (at least in this tamper protection operation) because line voltage should be present when the service disconnect switch 25 is closed. The processor 48 obtains the state of the service disconnect switch 25 through the communication of the state change by the digital control circuit 212 to the processor 48, discussed above.

It will be appreciated that the tamper detection arrangement described above may readily be modified for use in non-modular meters. The tamper detection arrangement advantageously requires only a single connection to the processor 48, through the EXT1 connection (provided through connector assembly 88). The use of a single connection helps conserve the limited resource of processor inputs in utility meter circuitry. Such an advantage is particularly useful in modular meters (wherein the processor is located in another module), but is also useful in any processor-based meter. Moreover, the implementation of an isolation mechanism provides additional advantages of complete isolation between the power lines and the processor 48 useful in any meter design.

It will be appreciated that the above-described embodiments are merely exemplary, and that those of ordinary skill in the art may readily devise their own implementations that incorporate the spirit of the present inventions and fall within the spirit and scope thereof.

We claim:

1. An arrangement for use in an electrical utility meter comprising:
    a metering unit operably coupled to utility power lines, the utility power lines connected to a load, the metering unit operable to generate metering information representative of an electrical quantity regarding electrical energy delivered to the load;
    a service disconnect circuit having a connected state, a disconnected state, and an armed state, said service disconnect circuit in the connected state operably coupling the utility power lines to the load, said service disconnect circuit in the disconnected state and in the armed state operably decoupling the utility power lines from the load; and
    a housing assembly disposed over at least a portion of the metering unit and the service disconnect circuit, the housing assembly having at least one electronic indicator visible from outside said housing assembly and operable to provide a visual signal representative of the service disconnect circuit in the armed state, the housing assembly further including an externally accessible actuator operably connected to the service disconnect circuit to change the service disconnect switch from the armed state to the connected state.

2. The arrangement of claim 1 wherein the service disconnect circuit comprises:
    at least one set of switch contacts having an open state and a closed state, the at least one set of switch contacts coupled between the utility power lines and the load; and
    control circuitry operable to
        cause the at least one set of switch contacts to be in the open state when the service disconnect circuit is in the disconnected state,
        cause the at least one set of switch contacts to be in the open state when the service disconnect circuit is in the armed state, and
        cause the at least one set of switch contacts to be in the closed state when the service disconnect circuit is in the connected state.

3. The arrangement of claim 1 wherein the service disconnect circuit is operably connected to a processing circuit, the processing circuit operable to provide a first signal to the service disconnect circuit changing the service disconnect circuit from the connected state to the disconnected state.

4. The arrangement of claim 3 wherein the processing circuit is further operable to provide a second signal to the service disconnect circuit changing the service disconnect circuit from the disconnected state to the armed state.

5. The arrangement of claim 4 further comprising a communication circuit operable to receive a disconnect signal from a remote device, the communication circuit operably connected to provide information representative of the disconnect signal to the processor, and wherein the processor is further operable to provide the first signal to the service disconnect circuit responsive to the provided information.

6. The arrangement of claim 5 wherein:
    the communication circuit is further operable to receive an arm signal;
    the communication circuit is further operably connected to provide second information representative of the arm signal to the processor; and
    the processor is further operable to provide the second signal to the service disconnect circuit responsive to the second information.

7. The arrangement of claim 1 further comprising a communication circuit operable to receive a disconnect signal from a remote device, the communication circuit operably connected to provide a first signal representative of the disconnect signal to the service disconnect circuit, the service disconnect circuit operable to change from the connected state to the disconnected state responsive to the first signal.

8. The arrangement of claim 7 wherein:
    the communication circuit is further operable to receive an arm signal;
    the communication circuit is further operably connected to provide a second signal representative of the arm signal to the processor; and
    the service disconnect circuit is further operable to change from the disconnected state to the armed state responsive to the signal.

9. The arrangement of claim 1 wherein the at least one electronic indicator is further operable to provide a second visual signal representative of the service disconnect circuit in the disconnected state.

10. The arrangement of claim 9 wherein the at least one electronic indicator includes a plurality of indicators.

11. The arrangement of claim 9 wherein the at least one electronic indicator includes a first indicator lamp operable to provide a visual signal indicative of the disconnect circuit in the armed state and a second indicator lamp operable to provide a visual signal indicative of the service disconnect circuit in the disconnected state.

12. The arrangement of claim 1 wherein the at least one electronic indicator includes an indicator lamp.

13. The arrangement of claim 12 wherein the indicator lamp includes a light emitting diode.

14. The arrangement of claim 1 wherein the at least one electronic indicator includes at least one liquid crystal display segment.

15. An arrangement for use in an electrical utility meter comprising at least one indicator lamp affixed to a meter housing, the at least one indicator lamp operable to provide a visual signal, the visual signal corresponding to a service disconnect circuit being in an armed state, the service disconnect circuit having the armed state, a disconnected state, and a connected state, the service disconnect circuit controllably coupled to an electrical power line to controllably disconnect and connect the electrical power line to a load.

16. The arrangement of claim 15 further comprising an externally accessible actuator, the externally accessible actuator operably coupled to cause the service disconnect circuit to change from the armed state to the connected state when actuated.

17. The arrangement of claim 15 wherein the at least one indicator lamp includes a first indicator lamp operable to provide the visual signal.

18. The arrangement of claim 17 wherein the at least one indicator lamp includes a second indicator lamp operable to provide a second visual signal corresponding to the service disconnect circuit being in the disconnected state.

19. The arrangement of claim 15 wherein the at least one indicator lamp includes a light emitting diode.

20. The arrangement of claim 16 wherein the actuator further includes a pushbutton mechanism.

21. A method, comprising:
  a) placing a service disconnect circuit in an armed state, the service disconnect circuit operably coupled to an electrical power line to controllably connect and disconnect the electrical power line from a load; and
  b) generating a first visual signal on an electronic indicator disposed on a meter housing, the first visual signal corresponding to the placement of the service disconnect circuit in the armed state.

22. The method of claim 21, further comprising:
  c) placing the service disconnect circuit in a connected state; and
  d) halting generation of the first visual signal.

23. The method of claim 22, wherein step c) further includes placing the service disconnect circuit in a connected state responsive to actuation of an externally accessible actuator disposed on the meter housing.

* * * * *